United States Patent [19]

Lundberg et al.

[11] Patent Number: 5,420,543

[45] Date of Patent: May 30, 1995

[54] METHOD AND APPARATUS FOR DETERMINING A CONSTANT GAIN OF A VARIABLE OSCILLATOR

[75] Inventors: James R. Lundberg; Charles E. Nuckolls, both of Austin, Tex.

[73] Assignee: Motorola, Inc., Schaumburg, Ill.

[21] Appl. No.: 165,687

[22] Filed: Dec. 13, 1993

[51] Int. Cl.$^6$ .......................................... H03L 7/087
[52] U.S. Cl. ..................... 331/1 A; 331/11; 331/17; 331/25; 327/150
[58] Field of Search ................. 331/1 A, 11, 17, 25; 328/155

[56] References Cited

U.S. PATENT DOCUMENTS

| | | | |
|---|---|---|---|
| 4,577,163 | 3/1986 | Culp | 331/1 A |
| 4,795,985 | 1/1989 | Gailbreath, Jr. | 328/155 |
| 5,122,761 | 6/1992 | Wischermann | 331/1 A |

Primary Examiner—Siegfried H. Grimm
Attorney, Agent, or Firm—Charlotte B. Whitaker

[57] ABSTRACT

A method and apparatus for implementing a constant gain in a digitally-controlled variable oscillator (DCO) 16 where the frequency of the DCO 16 is controlled via binary-weighted control signals. The frequency of the DCO 16 is modulated via arithmetic increments or decrements to the binary-weighted DCO control signals. The magnitude of the arithmetic increments and decrements defines the gain of the DCO. To maintain a constant gain, regardless of operating point or environment, a phase gain register 15 bit-shifts a current DCO control value by a predefined number of bit positions, thereby determining a phase gain value. The phase gain value defines the magnitude of an arithmetic increment or decrement of the current DCO control value, used to determine the next DCO control value. Since the phase gain register 15 uses a bit-shifted version of the current value of the DCO control, the gain value dynamically tracks all updates to the DCO control value, thereby implementing a constant gain in the DCO 16.

16 Claims, 2 Drawing Sheets

METHOD AND APPARATUS FOR DETERMINING A CONSTANT GAIN OF A VARIABLE OSCILLATOR

FIELD OF THE INVENTION

This invention relates generally to digital phase locked loops, and more particularly to implementation of a gain mechanism for a variable oscillator in a digital phase locked loop system.

CROSS-REFERENCE TO RELATED APPLICATIONS

This application is related to the following applications:
1. "METHOD AND APPARATUS FOR PERFORMING FREQUENCY DETECTION", Attorney Docket SC-02103A, by Lundberg et al. (Ser. No. 08/165,685);
2. "METHOD AND APPARATUS FOR PERFORMING FREQUENCY ACQUISITION IN AN ALL DIGITAL PHASE LOCK LOOP", Attorney Docket SC-02132A by Nuckolls et al. (Ser. No. 08/165,686);
3. "METHOD AND APPARATUS FOR PERFORMING PHASE ACQUISITION IN AN ALL DIGITAL PHASE LOCK LOOP", Attorney Docket SC-02183A, by Nuckolls et al. (Ser. No. 08/165,681);
4. "METHOD AND APPARATUS FOR PERFORMING FREQUENCY TRACKING IN AN ALL DIGITAL PHASE LOCK LOOP", Attorney Docket SC-02184A by Nuckolls et al. (Ser. No. 08/165,682).

All of which are filed simultaneously herewith and assigned to the assignee hereof.

BACKGROUND OF THE INVENTION

As microprocessor frequencies increase, it becomes necessary to deskew internal and external clocks. It is also desirable to run internal clocks faster than system clock rates. An analog phase-locked loop (PLL) has previously performed this function; however, as low-power applications for microprocessors proliferate, techniques for the implementation of on-chip power management are required. Generally, the implementation of a phase-locked loop (PLL) requires the acquisition of an appropriate frequency and phase using an internal ring oscillator. Analog phase-locked loops typically use a voltage-controlled oscillator (VCO) to generate a period signal that is "locked" to a reference clock signal.

The frequency of the VCO is modulated by an analog voltage adjusted via a feedback mechanism. Typically, the feedback mechanism is supplied from a sequential phase/frequency detector. The sequential phase/frequency detector outputs an "up" or "down" pulse proportional to phase error width and in the direction required to pull in the frequency of the VCO output signal to the target reference clock signal. The output of a sequential phase/frequency detector usually enables a charge pump driving to a loop filter (RC), which in turn controls the frequency of the VCO. The detector outputs can be arbitrarily small, and thus there is usually a dead band associated with such a detector where, for a certain window of time, there is no detectable output. Accordingly, during the dead band ("window width"), the PLL can detect neither "up" nor "down" pulses for a phase/frequency error of a magnitude equal to or less than the window width. This technique has been used in many applications, and requires careful tuning to maintain the right damping characteristics.

In the PLL, the gain of the VCO is defined as dF/dV (the change in VCO frequency per change in the analog control voltage). Ideally, a linear gain is preferred, but a linear gain can only be approximated. Instead, there is a nonlinear gain, resulting in a gain curve. Several parameters can impact the gain (e.g. VDD, temperature, processing, etc.). These parameters cause shifts in the gain curve and also impact the slope of the gain curve. Thus, over different operating conditions, there is a family of gain curves, each corresponding to different sets of conditions. A given increment in an analog control voltage can, therefore, cause substantially different changes in the VCO frequency depending upon the operating conditions. This phenomenon adversely affects the stability and limits the range and performance of the PLL. For example, the gain may be very high for a given set of conditions, resulting in excessive PLL output jitter. Alternatively, the gain may be low, resulting in an inability of the PLL to track frequency drift. It is, therefore, desirable to have a PLL wherein the gain tracks the operating point across all gain curves.

SUMMARY OF THE INVENTION

The present invention provides a method and apparatus for implementing a constant gain mechanism for a digitally-controlled variable oscillator (DCO) where the frequency of the DCO is controlled via binary-weighted control signals. The frequency of the DCO is modulated via arithmetic increments or decrements to the binary-weighted DCO control signals. The magnitude of the arithmetic increments and decrements defines the gain of the DCO. To maintain a constant gain, regardless of operating point or environment, the gain mechanism uses a bit-shifted value of a current DCO control value as the magnitude of arithmetic increment or decrement to the current DCO control value, to determine the next DCO control value. If a bit-shift displacement of ten of the binary-weighted DCO control value is used as the gain, then the gain represents approximately 1/1024 ($\frac{1}{2}^{10}$) of the current operating frequency of the DCO regardless of the current DCO control value. Since the gain mechanism uses a bit-shifted version of the current DCO control value, the gain tracks changes to the DCO control value occurring over time, due to changes in temperature and voltage ($V_{DD}$). Thus, the gain mechanism is independent of operating point, process, temperature, $V_{DD}$ level, etc.

DETAILED DESCRIPTION OF A PREFERRED EMBODIMENT

Figure 1:
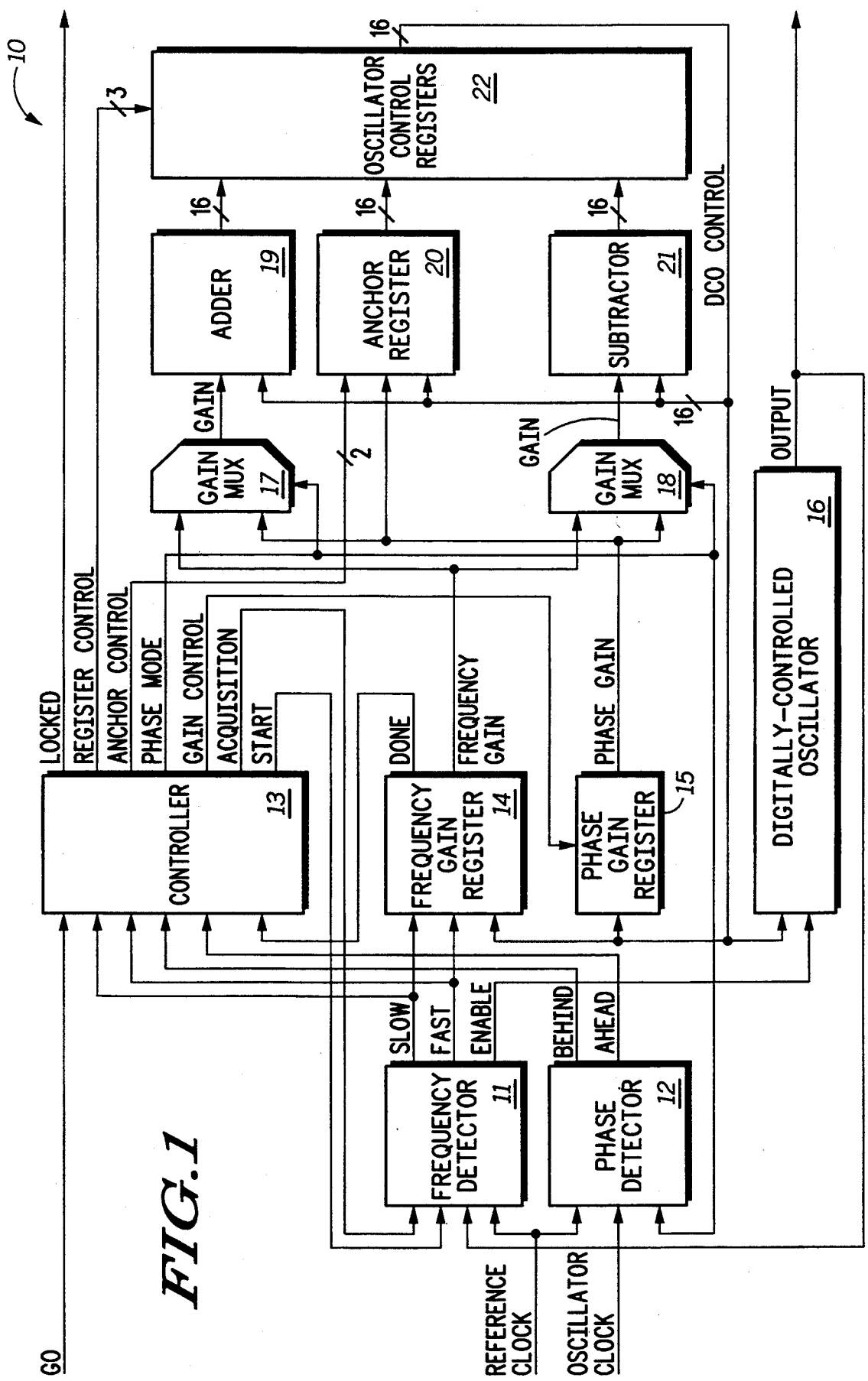
FIG. 1 illustrates in block diagram form an all digital phase lock loop in accordance with a preferred embodiment of the present invention.

The present invention can be more fully described with reference to FIGS. 1 and 2. Illustrated in FIG. 1 is a block diagram of an all digital phase-locked loop (ADPLL) 10, in accordance with a preferred embodiment of the present invention. In a preferred embodiment, the ADPLL 10 has four modes of operation, frequency acquisition, phase acquisition, phase maintenance and frequency maintenance. The ADPLL 10 includes a frequency detector 11, a phase detector 12, a controller 13, frequency and phase gain registers 14 and 15, respectively a digitally-controlled oscillator (DCO) 16, gain multiplexors 17 and 18, adder 19, anchor register 20, and subtractor 21. The DCO 16 uses a sixteen bit binarily-weighted control signal (DCO CONTROL) to implement changes in the frequency and phase of the DCO output, as disclosed in a patent application entitled "Delay Element with Digitally Controllable Gain" Ser. No. 07/993,757, by Lundberg et al. filed on Dec. 21, 1992 and assigned to the assignee hereof. The binary value of these control signals determines the frequency of the DCO 16. The DCO 16 has a gain which is defined as dF/d(DCO CONTROL). Thus, the larger the change in the binary value held by the DCO CONTROL signals, the larger the change in the frequency of the DCO 16. Accordingly, the frequency of the DCO 16 is changed via arithmetic increments or decrements to the sixteen control bits of the DCO CONTROL signal.

The ADPLL 10 starts in the frequency acquisition mode. In the frequency acquisition mode, the DCO control register 22 is initialized to a value of $4000 (where "$" refers to a hexadecimal value), in accordance with a preferred embodiment. Starting with a frequency gain of $2000, provided by the frequency gain register 14, and using a modified binary search algorithm, the DCO control register 22 is updated based on the output signal provided by the frequency detector 11. During frequency acquisition, the frequency detector 11 performs a digital frequency comparison between the reference clock signal and the OUTPUT signal provided by the DCO 16, and outputs a FAST or SLOW signal every two reference clock cycles (every other reference clock boundary). The FAST or SLOW digital signal initiates an increment or decrement to the DCO control register 22. The magnitude of the increments or decrements to the DCO control register 22 (the frequency gain), is dictated by the frequency gain register 14. In a preferred embodiment, gain is reduced every time a change in search direction occurs (i.e. a shift in the frequency gain register 14 occurs). Accordingly, one shift in the frequency gain register 14 causes a reduction in frequency gain by a factor of four, but only for one of either the subtract gain value or the add gain value. On successive shifts, gain reduction alternates between the add gain value and the subtract gain value. On every change in search direction, the frequency gain is reduced by a factor of two, as illustrated in Table I below.

In accordance with a preferred embodiment of the present invention, there is a one-to-one mapping of frequency gain weights to DCO CONTROL weights; for instance, an add gain value of $4000 would present an increment to the DCO CONTROL value of 100% if the DCO CONTROL value was $4000, as demonstrated in the first frequency detect cycle of Table I. When the frequency gain value stored in the frequency gain register 14 is less than the DCO CONTROL value stored in the DCO control register 22 bit-shifted right by ten bit positions, a frequency match has occurred between the reference clock signal and the output of the DCO 16 to an error of one in $2^{10}$ or ±0.1%. The ADPLL 10 then completes frequency acquisition by transferring the value in the DCO control register 22 to the anchor register 20, thereby storing the baseline frequency value in the anchor register 20.

TABLE I

| Frequency Detector Output/Cycle | | Add Gain | Subtract Gain | DCO CONTROL |
|---|---|---|---|---|
| Initial | | $4000 | $2000 | $4000 |
| Cycle 1. | SLOW | | | |
| Result: | | $4000 | $2000 | $8000 |
| Cycle 2. | FAST | | | |
| Result: | | $1000 | $2000 | $6000 |
| Cycle 3. | SLOW | | | |
| Result: | | $1000 | $800 | $7000 |
| Cycle 4. | SLOW | | | |
| Result: | | $1000 | $800 | $8000 |
| Cycle 5. | FAST | | | |
| Result: | | $400 | $800 | $7800 |
| Cycle 6. | SLOW | | | |
| Result: | | $400 | $200 | $7C00 |
| Cycle 7. | FAST | | | |
| Result: | | $100 | $200 | $7A00 |
| Cycle 8. | SLOW | | | |
| Result: | | $100 | $80 | $7B00 |
| Cycle 9. | SLOW | | | |
| Result: | | $100 | $80 | $7C00 |
| Cycle 10. | FAST | | | |
| Result: | | $40 | $80 | $7B80 |

Phase acquisition aligns the buffered output (divided by two) of the DCO 16 to the reference clock signal. Using the output of the DCO 16 rather than a global clock has two benefits. First, the global clock(s) can be turned off to save power during phase lock. Second, since the DCO 16 output runs at two times the reference clock frequency, the maximum phase error is reduced from 180° to 90°. During phase acquisition, on every reference clock signal, the phase detector 12 outputs a digital signal "AHEAD" or "BEHIND". The DCO control register 22 is incremented or decremented (in one direction only) every cycle by the gain value stored in the phase gain register 15, until a change in polarity of the phase error is detected. The phase gain register 15 dictates the magnitude of phase corrections. In the preferred embodiment, the phase gain register 15 performs a bit-shift right of the binary (DCO CONTROL) value currently held in the DCO control register 22, and stores this bit-shifted (gain) value of the DCO CONTROL value (base frequency). For a maximum phase error of 90°, the number of required phase corrections, n, as a function of shift displacement, d, can be approximated by equation 1.1 below:

$$n = \frac{-1 + \sqrt{1 + 2^{(d+1)}}}{2} \qquad \text{Eqn. 1.1}$$

Upon detecting the change in the polarity of the phase error, the ADPLL 10 completes phase lock by loading the value stored in the anchor register 20 into the DCO control register 22, thereby restoring the DCO control register 22 to the baseline frequency. In a preferred embodiment, during phase acquisition, the shift displacement (d) in the phase gain register 15 is eight, giving a worst case acquisition of eleven cycles.

When phase acquisition is complete, phase-locking has been achieved, and the ADPLL 10 enters a phase/frequency maintenance mode of operation. During phase maintenance, the DCO control register 22 is incremented or decremented every cycle (based on the output of the phase detector 12) by the gain value stored in the phase gain register 15, unless a change in the polarity of the phase error is detected. If a change in the polarity of the phase error is detected, the value stored in the anchor register 20 is loaded into the DCO control register 22 to restore the baseline frequency. Also, when a change in phase error polarity is detected, the shift displacement of the phase-gain register 15 is incremented (unless the shift displacement is at a maximum value), thereby reducing the phase gain by a factor of two. In a preferred embodiment, if a change in polarity is not detected for eight consecutive phase cycles, the phase gain shift displacement is decremented (unless the shift displacement is at a minimum value), thereby increasing the phase gain by a factor of two. This mechanism allows the phase gain to change as operating conditions warrant.

Frequency maintenance occurs simultaneously with phase maintenance. In accordance with the preferred embodiment, the anchor register 20 is updated during frequency maintenance, thereby changing the baseline frequency of operation of the DCO 16. After phase acquisition, if four consecutive increments of the DCO control register 22 occur, then the anchor register 20 is incremented once. Similarly, if four consecutive decrements of the DCO control register 22 occur, the anchor register 20 is decremented once. This mechanism allows the baseline frequency to track as operating conditions change with time.

Figure 2:
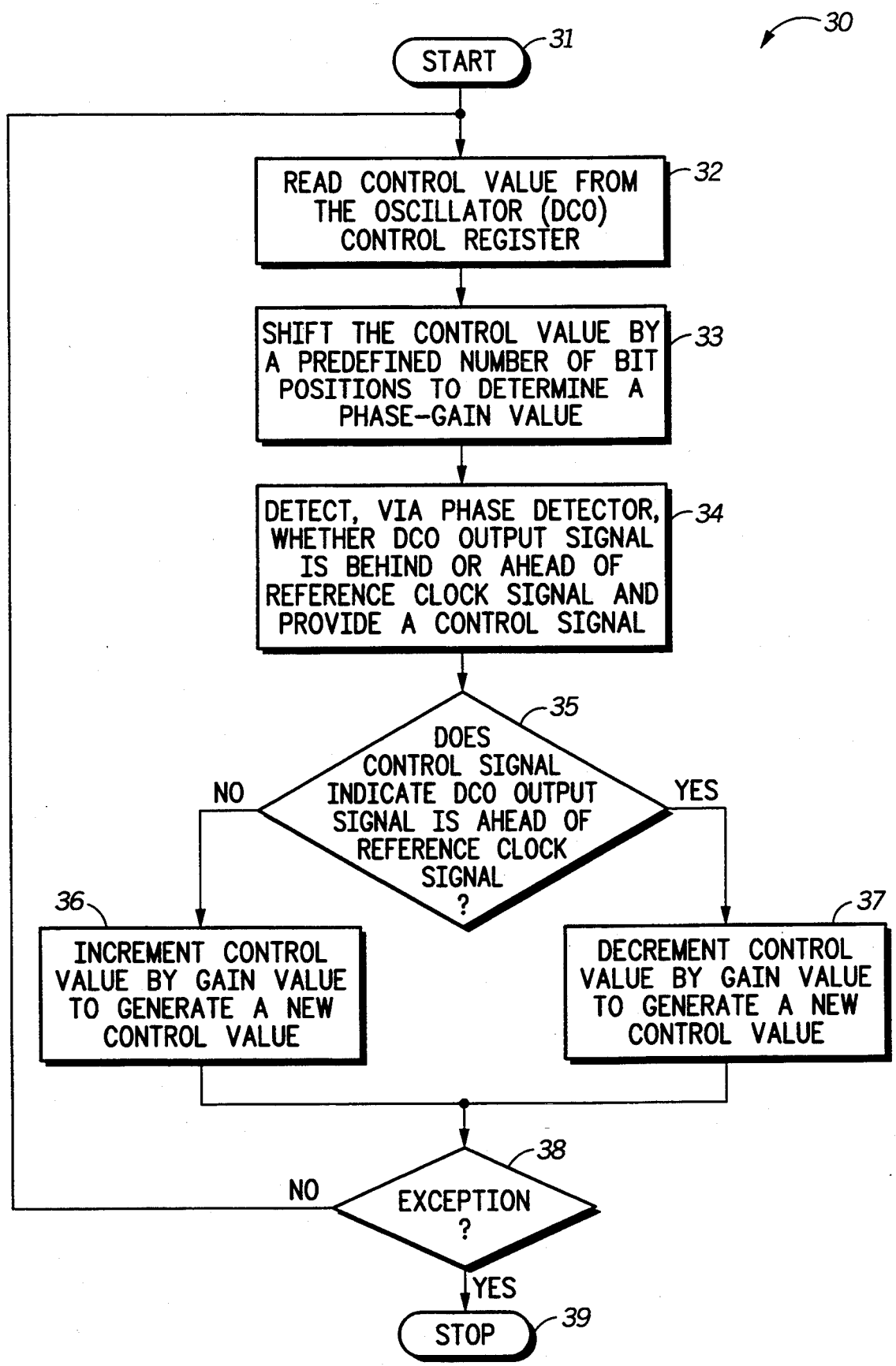
FIG. 2 illustrates in flow diagram form a method for implementing a constant gain in a variable digitally-controlled oscillator of FIG. 1, in accordance with the present invention.

Illustrated in FIG. 2 is a flow diagram 30 for implementing a constant gain in an oscillator, in accordance with the present invention. In accordance with the present invention, the gain of DCO 16 is defined as dF/dDCO CONTROL Value, where dDCO CONTROL value is the magnitude of the increments or decrements to the sixteen bit DCO control register 22. At step 32, the DCO CONTROL value is read from the DCO control register 22. The phase gain register 15 shifts the DCO CONTROL value by a predefined number of bit positions to thereby determine a phase gain value, at step 33. In the present invention, this phase gain value is used by the anchor register 20, the adder 19, and subtractor 21 to determine a next DCO CONTROL value. Since the current DCO CONTROL value defines a given frequency of operation of the DCO 16, the bit-shifted version of the DCO CONTROL (gain) value defines a constant incremental change relative to the current DCO CONTROL value.

At step 34, the phase detector 12 determines whether the OUTPUT signal from the DCO 16 is ahead of or behind the REFERENCE CLOCK signal. In a preferred embodiment, the phase detector 12 includes two edge-triggered D-flip-flops (not shown) in series (which implement a synchronizer) clocked by the REFERENCE CLOCK signal. The data input to the first flip-flop is a buffered output signal (OSCILLATOR CLOCK) generated by the DCO 16. The phase detector 12 outputs a control signal indicating whether the DCO output is AHEAD of or BEHIND the reference clock signal. As indicated at decision block 35, the controller 13 receives the control signal (AHEAD or BEHIND) and selects either the adder 19 or subtractor 21 to provide the new value to be stored in the DCO control register 22. Accordingly, in response to a REGISTER CONTROL signal provided by the controller 13, the 16-bit value stored in the DCO control register 22 will be provided by either the adder 19 or subtractor 21. Thus, if the OUTPUT signal is behind the reference clock signal, the adder 19 will increment the DCO CONTROL value by the phase gain value, at step 36, to generate a new DCO CONTROL value. The new DCO CONTROL value is then stored in the DCO control register 22. As a result thereof, the frequency of the DCO 16 is incrementally increased. Conversely, if the OUTPUT signal is ahead of the reference clock signal, the subtractor 21 will decrement the DCO CONTROL value by the phase gain value, at step 37, to generate the new DCO CONTROL value. The frequency of the DCO 16 will, therefore, be incrementally decreased.

In the present invention, the frequency of the DCO 16 is controlled via binary-weighted control signals (DCO CONTROL[15:0]). Accordingly, the frequency of the DCO 16 is modulated via arithmetic increments or decrements to the DCO CONTROL[15:0] signals. The magnitude of the arithmetic increments and decrements defines the gain of the DCO 16. To maintain a constant gain, regardless of operating point or environment, a bit-shifted version of the current DCO CONTROL[15:0] signal (stored in the DCO control register 22) is used as the magnitude of the arithmetic increment or decrement to the DCO CONTROL value, to determine the next DCO CONTROL value. For example, assuming a shift displacement of ten (10) bit positions and that the DCO 16 is running at an operating point corresponding to a DCO CONTROL[15:0] value of $1000, then the magnitude of the increment or decrement gain value (d(DCOCONTROL[15:0]) is $4. Whereas, if the DCO 16 is running at an operating point with $4000 on DCO CONTROL[15:0] control lines, then the magnitude of the increment or decrement is $10. Since the control lines for the DCO CONTROL value are binarily weighted, a shift displacement of 10 represents (to a first order) 1/1024th or $\frac{1}{2}^{10}$ of the operating frequency for both examples. Thus, the present invention ensures a constant gain across all gain curves. Since the gain increment is a bit-shifted version of DCO CONTROL[15:0], the gain increment dynamically tracks all updates to the DCO CONTROL signals. Therefore, as temperature, $V_{DD}$ (or other operating conditions) drift, the gain tracks updates to the DCO CONTROL signals. Furthermore, the shift displacement value is optimized to the operating range of the ADPLL 10.

In accordance with the present invention, when the DCO CONTROL value is incremented, the frequency of the DCO 16 is slightly increased to allow the OUTPUT signal of the DCO 16 to track the phase alignment of the reference clock. When the DCO CONTROL value is decremented, the frequency of the DCO 16 is slightly decreased to allow the OUTPUT signal from the DCO 16 to track the phase alignment of the reference clock. When an exception condition occurs, as indicated at step 38, the ADPLL 10 ceases operation, causing the constant gain mechanism to stop, at step 39.

While the present invention has been described in accordance with a preferred embodiment, it should be apparent to one of ordinary skill in the art that the invention may be practiced in numerous ways. For example, although the preferred embodiment describes how a constant gain mechanism may be implemented in an all digital phase locked loop, the present invention may also be used to enhance the performance and stability of an all digital delay-locked loop. Furthermore, the present invention may be used as to implement a constant gain mechanism in an analog digital phase locked-loop or delay-locked loop by using analog-digital converters in conjunction with weighted charge pumps or loop filters. Accordingly, it is intended by the appended claims to cover all modifications of the invention which fall within the true spirit and scope of the invention.

We claim:

1. In a system having a having a clock generator for generating a reference clock signal, a digitally controlled variable oscillator, a controller including an incrementer and decrementor coupled to said oscillator, a set of oscillator control registers, and a phase detector, a method for determining a constant gain for said variable oscillator, said method comprising the steps of:
    a) reading, via said controller, a control value stored in an oscillator control register;
    b) shifting said control value by a predefined number of bit positions to determine a phase gain value, said phase gain value defining an amount of frequency change of said variable oscillator; p1 c) updating said control value stored in said oscillator control register by incrementing or decrementing, via said incrementor or said decrementor, respectively, said control value by said phase gain value, in response to said phase detector producing an output signal indicating whether a rising edge of an output signal of said variable oscillator is ahead of or behind a rising edge of a reference clock signal, a magnitude of said phase gain value relative to said control value stored in said oscillator control register being a constant, resulting in a constant gain for said variable oscillator.

2. The method of claim 1 wherein the step of shifting said control value by a predefined number of bit positions to determine a phase gain value, comprises the step of performing a right-shift of said control value.

3. The method of claim 1 wherein the step of updating said control value stored in said oscillator control register occurs synchronously with the generation by said phase detector of said phase detector output signal.

4. In a system having a digitally controlled variable oscillator and a controller including an incrementer and decrementor coupled to said oscillator and a set of oscillator control registers, and a phase detector, a method for determining a constant gain for said variable oscillator, said method comprising the steps of:
    a) reading, via said controller, a binarily-weighted control value stored in an oscillator control register;
    b) shifting said binarily-weighted control value by a predefined number of bit positions to determine a phase gain value, said phase gain value defining an amount of frequency change of said variable oscillator;
    c) detecting, via said phase detector, whether a rising edge of an output signal of said variable oscillator is ahead or behind a rising edge of a reference clock signal, and providing a control signal indicative thereof;
    d) updating said binarily-weighted control value stored in said oscillator control register by incrementing or decrementing, via said incrementor or said decrementor, respectively, said binarily-weighted control value by said phase gain value, in response to a current logic state of said control signal, a magnitude of said phase gain value relative to said binarily-weighted control value stored in said oscillator control register being a constant, resulting in a constant gain for said variable oscillator.

5. The method of claim 4 wherein the step of shifting said binarily-weighted control value by a predefined number of bit positions to determine a phase gain value, comprises the step of performing a right-shift of said control value.

6. The method of claim 4 wherein the step of updating said binarily-weighted control value stored in said oscillator control register occurs synchronously with the generation by said phase detector of said control signal.

7. In a system having a digitally controlled variable oscillator, a controller including an incrementer and decrementor and a shifter coupled to said oscillator, a set of oscillator control registers, and a phase detector, a method for determining a constant gain for said variable oscillator, said method comprising the steps of:
    a) reading, via said controller, a binarily-weighted control value stored in an oscillator control register;
    b) shifting, via said shifter, said control value by a predefined number of bit positions to determine a phase gain value, said phase gain value defining an amount of frequency change of said variable oscillator;
    c) updating said control value stored in said oscillator control register by incrementing or decrementing, via said incrementor or said decrementor, respectively, said control value by said phase gain value, in response to a phase detector output signal, a magnitude of said phase gain value relative to said control value stored in said oscillator control register being a constant, resulting in a constant gain for said variable oscillator.

8. The method of claim 7 wherein the step of shifting said control value by a predefined number of bit positions to determine a phase gain value, comprises the step of performing a right-shift of said control value.

9. The method of claim 7 wherein the step of updating said control value stored in said oscillator control register occurs synchronously with the generation by said phase detector of said phase detector output signal.

10. In a system having a digitally controlled variable oscillator and a phase detector for detecting whether a rising edge of an output signal of said digitally controlled variable oscillator is ahead of or behind a rising edge of a reference clock signal, and providing a control signal indicative thereof, a constant gain controller for determining a constant gain for said variable oscillator, said constant gain controller comprising:
    an oscillator control register, coupled to said digitally controlled variable oscillator, for storing a predetermined number of oscillator control values used for implementing changes to said digitally controlled variable oscillator;
    a storage element, coupled to said oscillator control register, for shifting a current oscillator control value by a predefined number of bit positions to determine a phase gain value, said phase gain value defining an amount of frequency change of said digitally controlled variable oscillator;
    arithmetic logic, coupled to said oscillator control register and said storage element, for generating an updated oscillator control value by incrementing or decrementing, said current oscillator control value by said phase gain value, in response to a current logic state of said control signal provided by said phase detector, a magnitude of said phase gain value relative to said current oscillator control value being a constant.

11. The system of claim 10 wherein said arithmetic logic comprises:
   adder logic for incrementing said oscillator control value by said phase gain value to generate said updated oscillator control value, in response to said phase detector indicating that said oscillator output signal is behind said reference clock signal, and for providing said updated oscillator control value to said oscillator control register; and
   subtractor logic for decrementing said oscillator control value by said phase gain value to generate said updated oscillator control value, in response to said phase detector indicating that said oscillator output signal is ahead of said reference clock signal, and for providing said updated oscillator control value to said oscillator control register.

12. The system of claim 11 further comprising selection logic coupled to said arithmetic logic for selecting either said adder logic or said subtractor logic to provide said updated value to said oscillator control register, in response to receiving said control signal from said phase detector.

13. In a system having a digitally controlled variable oscillator and a phase detector for detecting whether a rising edge of an output signal of said digitally controlled variable oscillator is ahead of or behind a rising edge of a reference clock signal, and providing a control signal indicative thereof, a constant gain controller for determining a constant gain for said variable oscillator, said constant gain controller comprising:
   an oscillator control register, coupled to said variable oscillator, for storing a binarily-weighted control value used for implementing changes to said digitally controlled variable oscillator;
   a storage element, coupled to said oscillator control register, for shifting a current binarily-weighted control value by a predefined number of bit positions to determine a phase gain value, said phase gain value defining an amount of frequency change of said digitally controlled variable oscillator;
   arithmetic logic, coupled to said oscillator control register and said storage element, for generating an updated binarily-weighted control value by incrementing or decrementing, said current binarily-weighted control value by said phase gain value, in response to a current logic state of said control signal provided by said phase detector, a magnitude of said phase gain value relative to said current binarily-weighted control value being a constant.

14. The system of claim 13 wherein said arithmetic logic comprises:
   adder logic for incrementing said oscillator control value by said phase gain value to generate said updated oscillator control value, in response to said phase detector indicating that said oscillator output signal is behind said reference clock signal, and for providing said updated oscillator control value to said oscillator control register; and
   subtractor logic for decrementing said oscillator control value by said phase gain value to generate said updated oscillator control value, in response to said phase detector indicating that said oscillator output signal is ahead of said reference clock signal, and for providing said updated oscillator control value to said oscillator control register.

15. The system of claim 14 further comprising selection logic coupled to said arithmetic logic for selecting either said adder logic or said subtractor logic to provide said updated value to said oscillator control register, in response to receiving said control signal from said phase detector.

16. In a system having a digitally controlled variable oscillator and a phase detector for detecting whether a rising edge of an output signal of said digitally controlled variable oscillator is ahead of or behind a rising edge of a reference clock signal, and providing a control signal indicative thereof, a constant gain controller for determining a constant gain for said variable oscillator, said constant gain controller comprising:
   an oscillator control register, coupled to said variable oscillator, for storing a binarily-weighted control value used for implementing changes to said digitally controlled variable oscillator;
   a storage element, coupled to said oscillator control register, for shifting a current binarily-weighted control value by a predefined number of bit positions to determine a phase gain value, said phase gain value defining an amount of frequency change of said digitally controlled variable oscillator;
   arithmetic logic, coupled to said oscillator control register and said storage element, for generating an updated binarily-weighted control value by incrementing or decrementing, said current binarily-weighted control value by said phase gain value, in response to a current logic state of said control signal provided by said phase detector, a magnitude of said phase gain value relative to said current binarily-weighted control value being a constant; and
   control logic, coupled to said arithmetic logic and said phase detector, for receiving said control signal provided by said phase detector and for enabling said arithmetic logic to increment or decrement said current binarily-weighted control value by said phase gain value to generate said updated binarily-weighted control value, in response thereto.

* * * * *

UNITED STATES PATENT AND TRADEMARK OFFICE
CERTIFICATE OF CORRECTION

PATENT NO. : 5,420,543
DATED : May 30, 1995
INVENTOR(S) : James R. Lundberg et al.

It is certified that error appears in the above-indentified patent and that said Letters Patent is hereby corrected as shown below:

Column 7, line 18, after "Oscillator;" delete [p1 c)]

Column 7, line 19, before "updating", insert --c)--

Signed and Sealed this

Thirtieth Day of April, 1996

Attest:

BRUCE LEHMAN

*Attesting Officer*     *Commissioner of Patents and Trademarks*